United States Patent [19]

Kim et al.

[11] Patent Number: 4,751,349

[45] Date of Patent: Jun. 14, 1988

[54] ZIRCONIUM AS AN ADHESION MATERIAL IN A MULTI-LAYER METALLIC STRUCTURE

[75] Inventors: Jungihl Kim, Peekskill, N.Y.; Walter F. Lange, Longmont, Colo.; Da-Yuan Shih, Poughkeepsie; Sheree H. Wen, Briarcliff Manor, both of N.Y.

[73] Assignee: International Business Machines Corporation, Armonk, N.Y.

[21] Appl. No.: 919,530

[22] Filed: Oct. 16, 1986

[51] Int. Cl.[4] .............................................. H05K 1/00
[52] U.S. Cl. ................................ 174/68.5; 428/651; 428/660; 428/674
[58] Field of Search ............... 174/68.5; 428/660, 674, 428/651

[56] References Cited

U.S. PATENT DOCUMENTS

| | | | |
|---|---|---|---|
| 2,857,663 | 10/1958 | Beggs | 428/660 |
| 3,379,568 | 4/1968 | Holmes | 174/68.5 |
| 3,461,524 | 8/1969 | Lepselter | 174/68.5 |
| 3,621,442 | 11/1971 | Racht et al. | 174/68.5 X |
| 3,634,159 | 1/1972 | Croskery | 174/68.5 X |
| 3,647,585 | 3/1972 | Fritzinger et al. | 174/68.5 X |
| 3,699,011 | 10/1972 | Nishimura | 174/68.5 X |
| 3,798,011 | 3/1974 | Sharp, Jr. | 428/651 X |
| 4,016,050 | 4/1977 | Lesh et al. | 428/660 |
| 4,042,753 | 8/1977 | Smith | 428/660 X |
| 4,153,518 | 5/1979 | Holmes et al. | 428/630 X |
| 4,424,409 | 1/1984 | Kuttner | 174/685 |
| 4,594,473 | 6/1986 | Inoue et al. | 174/68.5 |

OTHER PUBLICATIONS

Funari; W. F. et al; Metallized Multilayer Ceramic Packages with Welded I/O Pins; IBM Technical Bulletin; vol. 21, No. 10, Mar. 79, pp. 3974-3975.
Abolafia, O. R. et al; Use of Polyimide to Obtain a Smooth Surface, IBM Technical Disclosure Bulletin; vol. 20, No. 8, Jan. 1978, p. 3020.

*Primary Examiner*—Morris H. Nimmo
*Attorney, Agent, or Firm*—Jesse L. Abzug

[57] ABSTRACT

A layer of zirconium can be used as an adhesion layer between a ceramic or polyimide substrate and subsequently applied metallic layers. Following the zirconium layer, copper can be deposited followed by a reaction barrier layer and a wettable surface layer such as gold. This type of structure can be used for pin bracing, chip joining, and/or wire connections.

3 Claims, 1 Drawing Sheet

ZIRCONIUM AS AN ADHESION MATERIAL IN A MULTI-LAYER METALLIC STRUCTURE

DESCRIPTION

BACKGROUND OF THE INVENTION

1. Field of Invention

This invention relates to the use of zirconium in a multi-layer thin film metallic structure. More particularly, the use of zirconium as an adhesive layer between a ceramic or polyimide substrate and a copper or aluminum layer is disclosed.

2. Background Information

As the integrated circuit density continues to increase towards Very Large Scale Integration (VLSI), the increases in both the input/output (I/O) counts and wiring densities have placed stringent demands on the multi-layer chip packaging technologies. In order to interconnect large numbers of integrated circuit (IC) chips, each containing high densities of I/O terminals, the ability to produce fine and precise patterns with great reduction of lead pitch is becoming increasingly crucial to the success of future VLSI packaging technologies.

Today's thick film multi-layer ceramic (MLC) technology has reached a limit, because the silk screening method is not capable of producing patterns with a minimum line width of less than 3 mils, and the sintering process is plagued with large dimensional tolerances. Thick film MLC technology by itself is not enough to meet the requirements for advanced VLSI packaging technology.

One method of providing inter-chip wiring and I/O interconnections utilizes thin film polyimide packages on top of a conventional MLC base. The structure consists of a MLC substrate as a base to supply current and mechanical support and thin film layers processed on top of the MLC base to provide inter-chip wiring and to fan-out the semiconductor chip contacts to the thin film wiring layers. Among the materials tested, the use of polyimide as a low dielectric insulating layer between finely patterned high conductivity copper layers achieves the best performance.

One of the problems, however, with the use of copper for fine wiring, is that a pure copper to polyimide bond is not capable of withstanding the subsequent process and handling steps. Therefore, it is desirable to provide a method for enhancing the adhesion between copper and a polyimide substrate.

OBJECTS OF THE INVENTION

It is an object of this invention to provide a multi-layer thin film metallurgy which provides for enhanced adhesion of copper to a polyimide layer.

It is another object of this invention to provide a thin film metallurgy for joining a copper layer to a ceramic substrate.

It is still another object to provide an integrated circuit package which includes a ceramic base and a plurality of thin film metal layers separated by polyimide dielectric layers.

SUMMARY OF THE INVENTION

In accordance with these objects, a thin layer of zirconium is used as an adhesion layer between the polyimide layer and the copper layer. The adhesion strength between zirconium and polyimide is superior to alternative adhesion layers such as chromium or titanium. Furthermore, sputter cleaning of the polyimide surface is unnecessary with zirconium. As an alternative, zirconium and copper can be co-deposited at the beginning of film deposition.

Additionally, for those applications where polyimide is not necessary for packaging, zirconium can be used as an adhesion layer directly to a ceramic substrate. Following the zirconium layer, copper can be deposited followed by a reaction barrier layer and a wettable surface layer such as gold. This type of structure can be used for pin brazing, chip joining, and/or wire connections.

BRIEF DESCRIPTION OF THE DRAWINGS

The foregoing and other advantages of the invention will be more fully understood with reference to the description of the preferred embodiment and the drawing wherein.

DESCRIPTION OF THE PREFERRED EMBODIMENT

Figure 1:
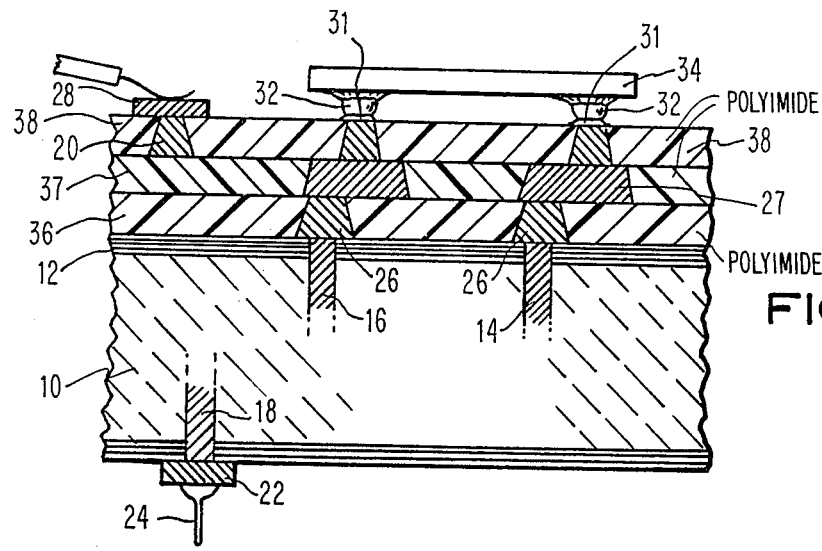
FIG. 1 is a cross-sectional view of a multi-layer ceramic substrate with a multi-layer polyimide structure.

A multi-layer ceramic (MLC) substrate 10 is shown in FIG. 1. MLC is known in the art to be comprised of a plurality of thin ceramic sheets which are then aligned and sintered together to form a thick MLC substrate for making circuit interconnections for semiconductor devices. The ceramic material can be the alumina ceramic ($Al_2O_3$) or the glass ceramic type, one form of which is known as alpha-cordierite. Contained within the layers 12 of substrate 10 are conductors which are used to carry electrical signals through the substrate 10. Some of these conductors are illustrated as vias 14, 16, and 18 which are used to carry signals to and from the top and bottom surfaces of substrate 10, where they can connect with other components.

For making electrical connections with vias 14, 16, and 18, a multi-layer metal structure which includes a thin zirconium layer has shown excellent mechanical and electrical properties. While the actual structure of the multi-layer metallurgy varies depending upon the type of interconnection, the use of the zirconium layer is common to all structures. For example, the multi-layer pad 22 which is used for connecting pin 24 to via 18 engineering change pad 28, and surface pads 31, consist of four layers. The capture pads 26 which are connected to vias 14 and 16 consist of a three layer metal structure.

Also shown in FIG. 1 is a 3-layer polyimide structure comprised of polyimide layers 36, 37, 38. This polyimide structure is used for redistribution, inter-chip wiring 27 and interconnections between the substrate 10 and semiconductor chip 34. Additionally, wiring within the polyimide layers can also be used to connect one semiconductor chip directly to other chips.

4-Layer Metallurgy

For metal pads that will be subjected to soldering or brazing for circuit interconnections, a 4-layer structure comprising a zirconium adhesion layer, a copper layer, a reaction barrier layer, and a wettable surface layer is preferred. Examples of the types of pads which require a 4-layer structure are pad 22 which has pin 24 brazed to it; engineering change pad 28; and surface pads 31 which connect to the solder balls 32 on semiconductor chip 34.

Figure 2:
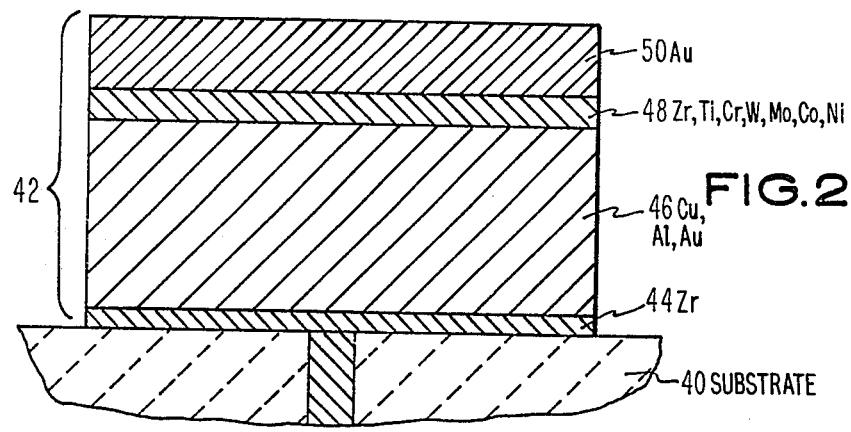
FIG. 2 is a cross-sectional view of a substrate with a 4-layer metallic I/O pad.

Referring to FIG. 2, the sequence of metallizing the pads begins with the alignment of a mask (not shown) with the substrate 40, which may be either ceramic, organic or metallic in nature. The type of mask used, metal, plastic, polymer, photoresist, etc. is not critical to this invention and can be any type commonly used in the art. If polyimide is not to be used as a dielectric layer, the formation of the multi-layer thin film pad 42 begins with the deposition of a thin layer of zirconium 44. The zirconium layer 44 can be deposited by electron gun evaporation, sputtering, ion plating or other methods known in the art. The thickness of the zirconium layer 44 is preferably within the range 30–2,000 Angstroms.

A layer 46 of copper, aluminum or gold is next deposited over zirconium layer 44, using the same deposition mask structure. Layer 46 can also be deposited using the deposition techniques described above, with a preferred thickness in the range 2–20 microns.

To prevent layer 46 from reacting with a solder or braze during subsequent manufacturing processes, a reaction/diffusion barrier layer 48 with a thickness in the range 0.5–3.0 microns is deposited. The reaction barrier layer can be zirconium, titanium, chromium, cobalt, tungsten, molybdenum or nickel.

Finally, a wettable surface layer 50 is applied to enhance the wettability of the multi-layer film for brazing or soldering. Gold, in the range 0.3–10.0 microns has been found to be effective.

Figure 3:
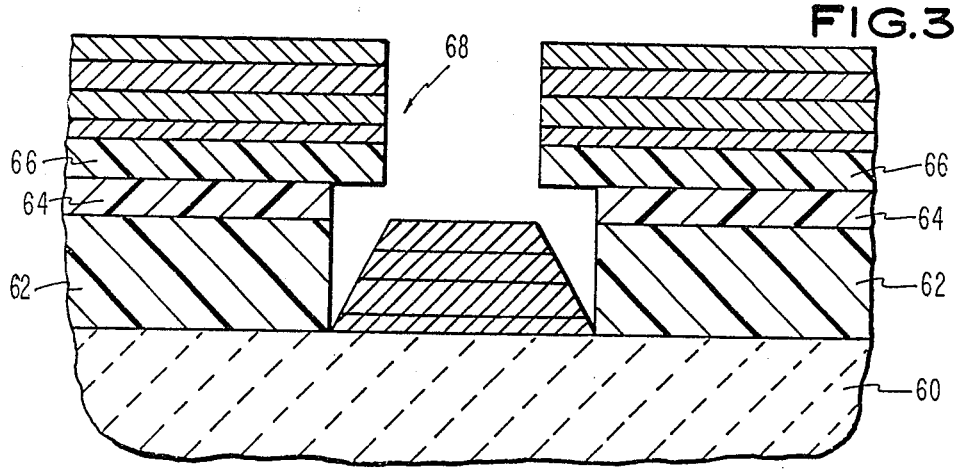
FIG. 3 is a cross-sectional view of a substrate with a polyimide layer and metal structure.

If polyimide layers are to be used with the multi-layer metallurgy, the process described is modified to include additional steps. Referring to FIG. 3, a substrate 60 is provided. Substrate 60 can be ceramic, or a previously deposited layer of polyimide. A layer 62 of polyimide is sprayed or spun on, with a thickness of approximately 5.0 microns. Following this layer, a second layer 64 of soluble polyimide is applied. Layer 64 will be used as a lift-off layer after metal deposition.

A photoresist layer 66 is applied and dried, and a metallization pattern is lithographically defined and developed as well-known in the art. Using the developed photoresist pattern as an etch mask, layers 64 and 62 are etched in a reactive ion etch chamber using $O_2$ or a mixture of $O_2/CF_4$, creating via 68. Then, the metal layers are deposited as described previously. Lift-off is achieved by immersing the substrate 60 in a solvent capable of dissolving soluble polyimide layer 64, such as n-methylpyrrolidone (NMP).

If the metallurgy is to cover a portion of a metal layer previously applied, it may be necessary to sputter clean the surface to remove any oxidation that may have formed on the metal surface, prior to depositing an additional multi-layer structure.

This same process can be repeated as necessary to create a multi-layer wiring structure as shown in FIG. 1.

3-Layer Metallurgy

For metal pads or lines that will not be subjected to the stresses of brazing and/or soldering, such as capture pads 26, the process outlined above can be followed with the following exceptions: (1) the reaction barrier layer does not need to be as thick (30–2000 Angstroms is sufficient) and (2) the wettable surface layer is not needed. All other process steps, conditions, etc. are the same.

While the invention has been particularly shown and described with reference to a preferred embodiment thereof, it will be understood by those skilled in the art that various changes in detail may be made therein without departing from the spirit, scope and teaching of the invention. Accordingly, the structure and process herein disclosed is to be considered merely as illustrative, and the invention is to be limited only as specified in the claims.

What is claimed is:

1. A multi-layer metallic structure for making circuit interconnections on a substrate comprising:
   a zirconium layer covering a substrate;
   an aluminum layer covering said zirconium layer;
   a reaction barrier layer overlying said aluminum layer;
   said reaction barrier layer selected from the group consisting of zirconium and titanium; and
   a layer of gold covering said reaction barrier layer.

2. A metallic structure for making circuit interconnections between an integrated circuit and a substrate comprising:
   a layer of zirconium applied to a substrate;
   a layer of copper covering said zirconium layer; and
   a reaction barrier layer overlying said copper layer, said reaction barrier layer selected from the group consisting of zirconium, titanium, chromium, tungsten and molybdenum.

3. The metallic structure as claimed in claim 2 further comprising a layer of gold applied over said reaction barrier layer.

* * * * *